(12) United States Patent
Kronholz et al.

(10) Patent No.: US 8,349,694 B2
(45) Date of Patent: Jan. 8, 2013

(54) ENHANCED CONFINEMENT OF HIGH-K METAL GATE ELECTRODE STRUCTURES BY REDUCING MATERIAL EROSION OF A DIELECTRIC CAP LAYER UPON FORMING A STRAIN-INDUCING SEMICONDUCTOR ALLOY

(75) Inventors: Stephan Kronholz, Dresden (DE); Markus Lenski, Dresden (DE); Andy Wei, Dresden (DE); Martin Gerhardt, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/909,149

(22) Filed: Oct. 21, 2010

(65) Prior Publication Data
US 2011/0159654 A1 Jun. 30, 2011

(30) Foreign Application Priority Data
Dec. 31, 2009 (DE) .......................... 10 2009 055 435

(51) Int. Cl.
| | |
|---|---|
| H01L 21/28 | (2006.01) |
| H01L 27/12 | (2006.01) |
| H01L 21/8238 | (2006.01) |
| H01L 21/84 | (2006.01) |
| H01L 29/165 | (2006.01) |
| H01L 29/66 | (2006.01) |
| H01L 29/78 | (2006.01) |

(52) U.S. Cl. ........ 438/275; 438/155; 438/300; 438/308; 438/785; 438/787; 438/795; 257/65; 257/70; 257/190; 257/192; 257/310; 257/289; 257/350; 257/392; 257/410

(58) Field of Classification Search .................. 438/283, 438/229, 285, 301, 595, 270, 201, 200, 199; 257/E21.632, E21.403, 392, E21.19, E21.409, 257/E21.631, 351
See application file for complete search history.

(56) References Cited

U.S. PATENT DOCUMENTS
| | | | | |
|---|---|---|---|---|
| 2002/0179962 | A1* | 12/2002 | Kinoshita | ...................... 257/315 |
| 2005/0266639 | A1* | 12/2005 | Frohberg et al. | ............... 438/257 |
| 2007/0138570 | A1 | 6/2007 | Chong et al. | .................. 438/219 |

(Continued)

FOREIGN PATENT DOCUMENTS
| | | |
|---|---|---|
| EP | 1 959 491 A2 | 8/2008 |
| JP | 2009-224386 A | 10/2009 |
| WO | WO 2009/122345 A1 | 10/2009 |

OTHER PUBLICATIONS

Translation of Official Communication from German Patent Office for German Patent Application No. 10 2009 055 435.1 dated Oct. 11, 2010.

*Primary Examiner* — Olik Chaudhuri
*Assistant Examiner* — Wilner Jean Baptiste
(74) *Attorney, Agent, or Firm* — WIlliams, Morgan & Amerson, P.C.

(57) ABSTRACT

When forming the strain-inducing semiconductor alloy in one type of transistor of a sophisticated semiconductor device, superior thickness uniformity of a dielectric cap material of the gate electrode structures may be achieved by forming encapsulating spacer elements on each gate electrode structure and providing an additional hard mask material. Consequently, in particular, in sophisticated replacement gate approaches, the dielectric cap material may be efficiently removed in a later manufacturing stage, thereby avoiding any irregularities upon replacing the semiconductor material by an electrode metal.

18 Claims, 6 Drawing Sheets

U.S. PATENT DOCUMENTS

| | | | |
|---|---|---|---|
| 2008/0274594 A1* | 11/2008 | Karve et al. | 438/153 |
| 2009/0023261 A1* | 1/2009 | Hirano | 438/270 |
| 2009/0206416 A1 | 8/2009 | Cheng et al. | 257/369 |
| 2009/0291540 A1* | 11/2009 | Zhang et al. | 438/229 |
| 2009/0321850 A1* | 12/2009 | Griebenow et al. | 257/392 |
| 2010/0072523 A1 | 3/2010 | Sato et al. | 257/289 |

* cited by examiner

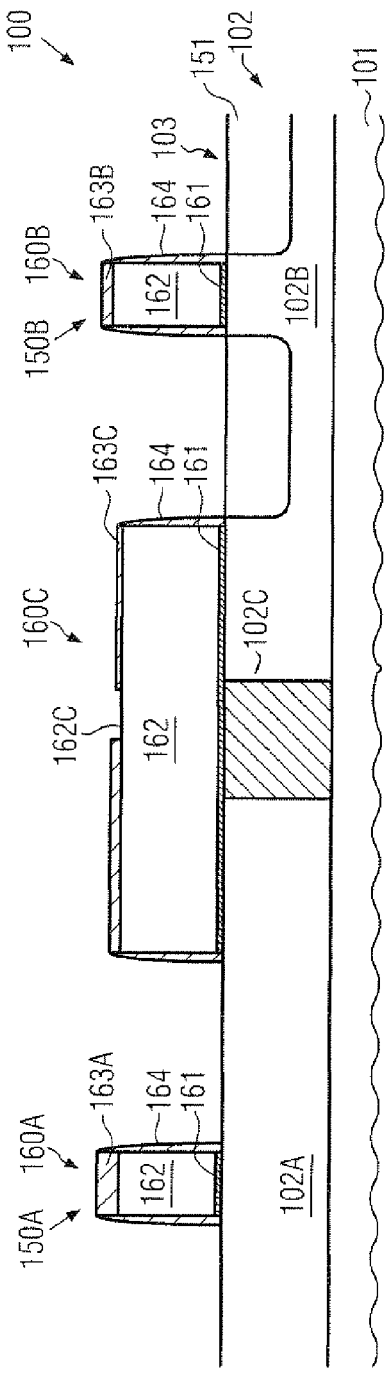
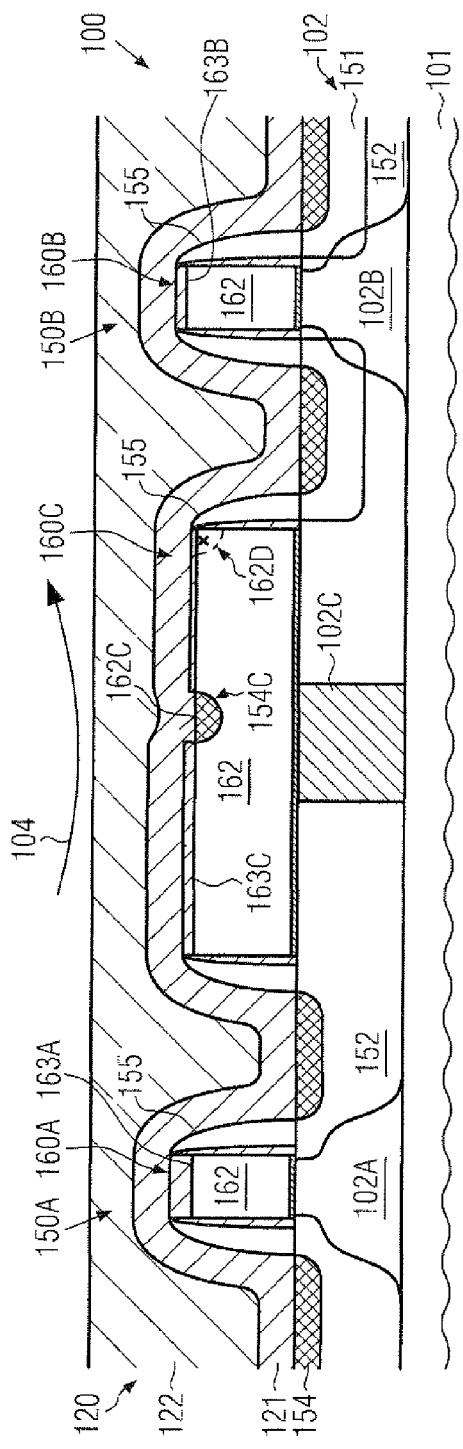
FIG. 1a (prior art)
FIG. 1b (prior art)

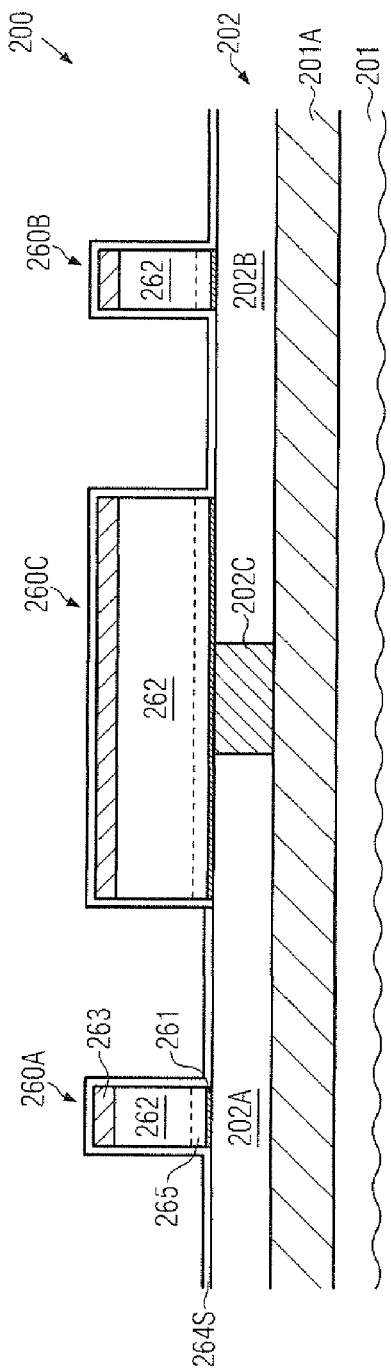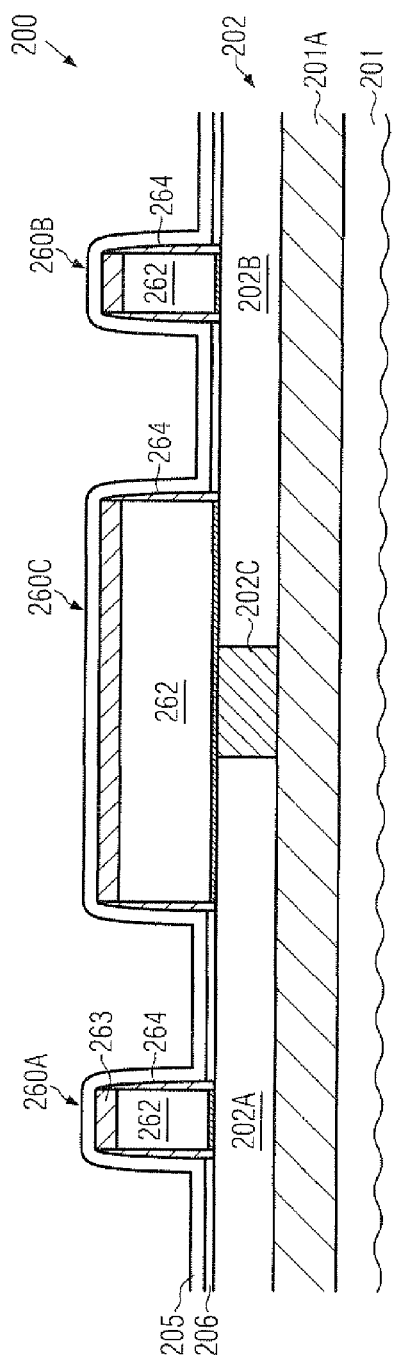

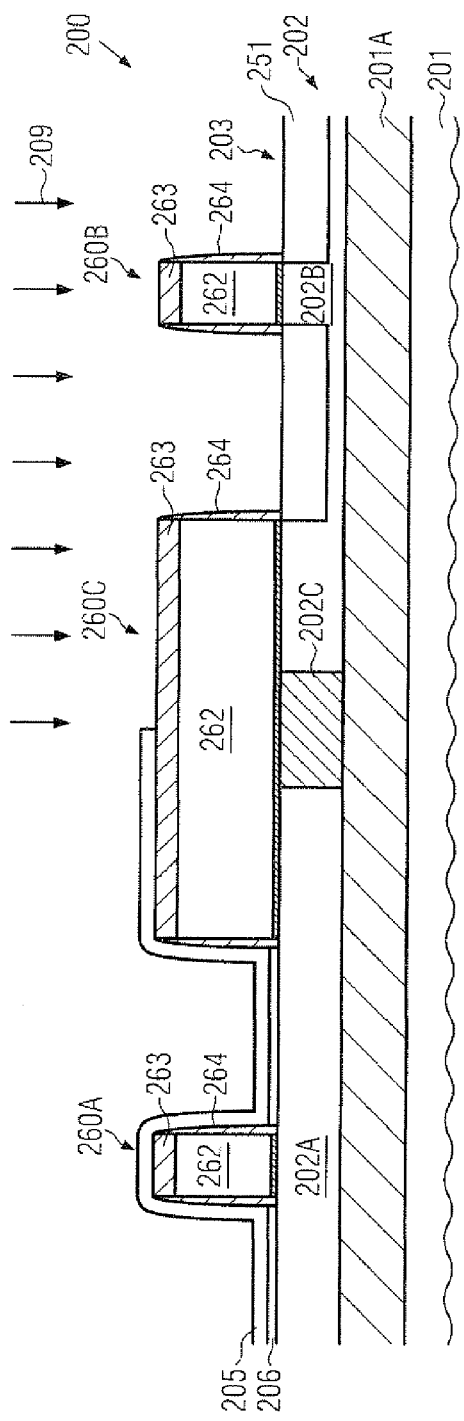
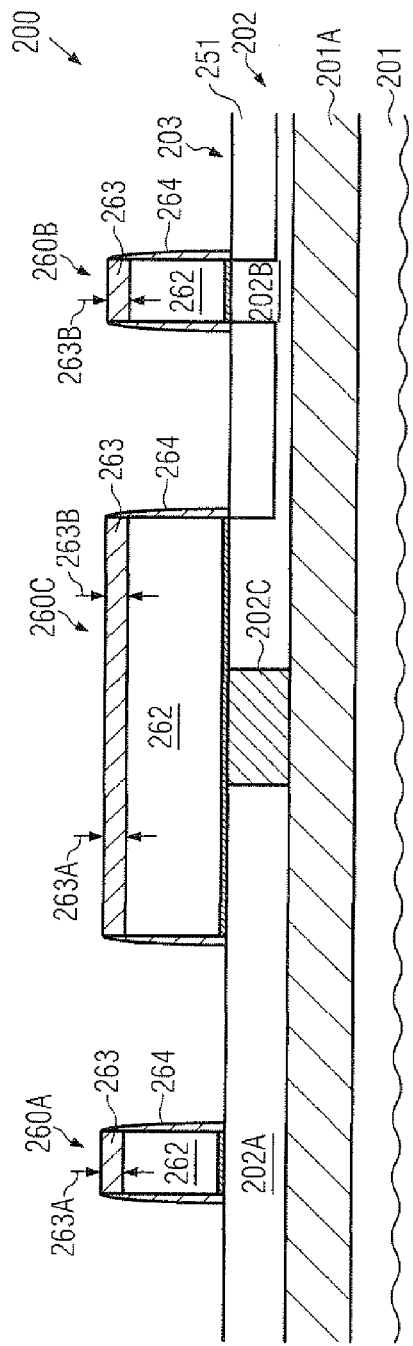

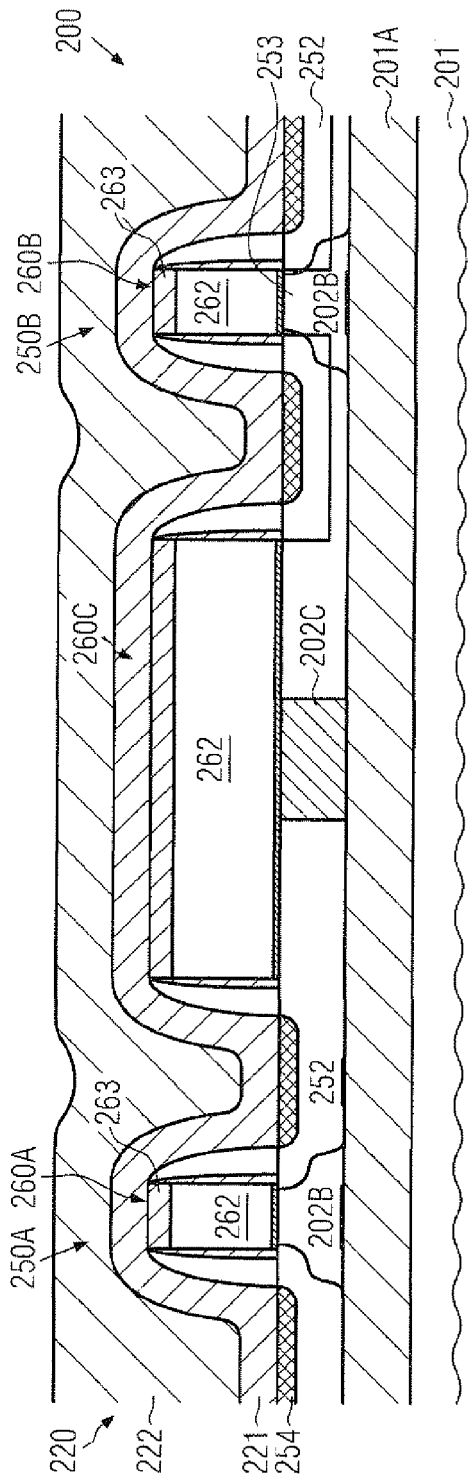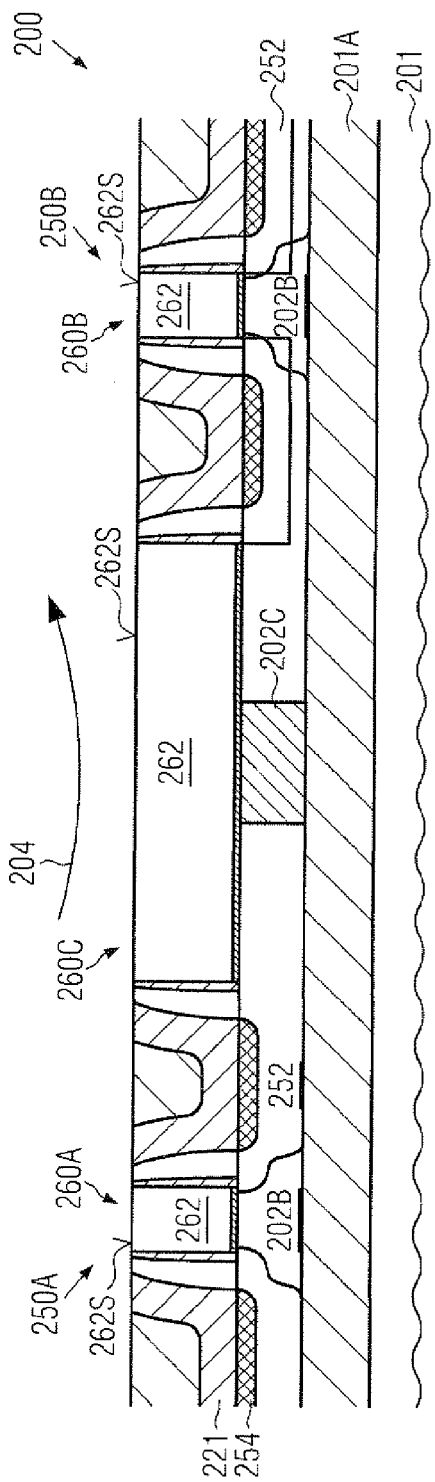

ENHANCED CONFINEMENT OF HIGH-K METAL GATE ELECTRODE STRUCTURES BY REDUCING MATERIAL EROSION OF A DIELECTRIC CAP LAYER UPON FORMING A STRAIN-INDUCING SEMICONDUCTOR ALLOY

BACKGROUND OF THE INVENTION

1. Field of the Invention

Generally, the present disclosure relates to the fabrication of highly sophisticated integrated circuits including transistor elements that comprise a high-k metal gate electrode structure in combination with an embedded strain-inducing semiconductor alloy.

2. Description of the Related Art

The fabrication of advanced integrated circuits, such as CPUs, storage devices, ASICs (application specific integrated circuits) and the like, requires a great number of circuit elements to be formed on a given chip area according to a specified circuit layout, wherein field effect transistors represent one important type of circuit element that substantially determines performance of the integrated circuits. Currently, a plurality of process technologies are practiced, wherein, for many types of complex circuitry, including field effect transistors, MOS technology is one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a planar transistor architecture, the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different silicon regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide has preferably been used as a base material for gate insulation layers that separate the gate electrode, frequently comprised of polysilicon, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling, in combination with sophisticated lateral and vertical dopant profiles in the drain and source regions, to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. That is, conventionally, the thickness of the silicon dioxide layer has been correspondingly reduced to provide the required capacitance between the gate and the channel region. For example, a channel length of approximately 0.08 µm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by the direct tunneling of charge carriers through an ultra-thin silicon dioxide gate insulation layer may reach values for an oxide thickness in the range of 1-2 nm that may no longer be compatible with requirements for many types of circuits.

For this reason, new strategies have been developed in overcoming the limitations imposed by high leakage currents of extremely thin silicon oxide-based gate insulation layers. One very promising approach is the replacement of the conventional dielectric materials, at least partially, by dielectric materials having a dielectric constant that is significantly greater than the dielectric constant of silicon dioxide-based materials. For example, dielectric materials, also referred to as high-k dielectric materials, with a dielectric constant of 10.0 and significantly higher may be used, for instance in the form of hafnium oxide, zirconium oxide and the like. In addition to providing a high-k dielectric material in the gate insulation layers, appropriate metal-containing materials may also have to be incorporated since the required work function values for P-channel transistors and N-channel transistors may not be obtained on the basis of standard polysilicon gate materials in combination with the high-k dielectric material. To this end, appropriate metal-containing materials may be provided so as to cover the sensitive high-k dielectric materials and act as a source for incorporating an appropriate metal species, such as lanthanum, aluminum and the like, in order to appropriately adjust the work function for N-channel transistors and P-channel transistors, respectively. Furthermore, due to the presence of a metal-containing conductive material, the generation of a depletion zone, as may typically occur in polysilicon-based electrode materials, may be substantially avoided.

The process of fabricating a sophisticated gate electrode structure on the basis of a high-k dielectric material may require a moderately complex process sequence in order to adjust an appropriate work function for the transistors of different conductivity type and due to the fact that high-k dielectric materials may typically be very sensitive when exposed to certain process conditions, such as high temperatures in the presence of oxygen and the like. Therefore, different approaches have been developed, such as providing the high-k dielectric material at an early manufacturing stage and processing the semiconductor devices with a high degree of compatibility with standard process techniques, wherein the typical electrode material polysilicon may be replaced in a very advanced manufacturing stage with appropriate metals for adjusting the work function of the different transistors and for providing a highly conductive electrode metal.

In other approaches, the sophisticated gate electrode structures may be formed in an early manufacturing stage, while the further processing is based on many well-established process strategies. In this case, the high-k dielectric material and any metal species for adjusting the work function may be provided prior to or upon patterning the gate electrode stack, which comprises well-established materials, such as silicon and silicon/germanium.

In addition to providing sophisticated gate electrode structures, transistor performance may also be significantly enhanced by using a strain component in the channel region of at least one type of transistor, such as in P-channel transistors. It is well known that providing a compressive strain component along the current flow direction in a silicon channel region having a standard crystalline configuration may result in superior mobility of holes in the channel region, thereby also improving the drive current capability of the P-channel transistor. For this reason, a plurality of strain-inducing mechanisms have been developed, wherein one promising approach may be based on a strain-inducing semiconductor alloy, which is embedded into the active region of P-channel transistors after patterning the gate electrode structure. To this end, cavities may be formed in the active region laterally adjacent to the gate electrode structure and the cavities are subsequently refilled with a strain-inducing semiconductor alloy, such as a silicon/germanium material, which is grown in a strained state, that in turn induces a desired compressive strain component in the channel region. The strain-inducing silicon/germanium material may be deposited on the basis of selective epitaxial growth techniques, in which process parameters are adjusted such that significant material deposition is restricted to crystalline silicon areas, while any material deposition on dielectric surface areas is suppressed. In order to avoid undue material growth on the gate electrode structures, the polysilicon material has to be reliably confined, at least during the selective epitaxial growth process. For this purpose, the gate electrode structures are typically provided with a dielectric cap material, such as a silicon nitride material, and a silicon nitride spacer layer is typically provided to cover the N-channel transistors, while the silicon nitride spacer layer is patterned into sidewall spacer elements at the gate electrode structure of the P-channel transistor, wherein, in the same etch sequence, the corresponding cavities are also formed in the active region of the P-channel transistor.

Since the dielectric cap material has to be removed in a later manufacturing stage, it turns out that the incorporation of the strain-inducing semiconductor alloy in the P-channel transistor may significantly affect production yield in manufacturing strategies in which sophisticated high-k metal gate electrode structures are to be provided, as will be explained in more detail for a replacement gate approach with reference to FIGS. 1a-1b.

FIG. 1a schematically illustrates a cross-sectional view of a semiconductor device 100 comprising a substrate 101, above which is formed a silicon-based semiconductor layer 102. The substrate 101 and the semiconductor layer 102 may represent a silicon-on-insulator (SOI) configuration, when a buried insulating material (not shown) is positioned between the substrate 101 and the semiconductor layer 102. In other cases, a "bulk" configuration is provided when the semiconductor layer 102 represents a portion of a crystalline material of the substrate 101. The semiconductor layer 102 comprises a plurality of "active regions," such as semiconductor regions 102A, 102B, which are to be understood as semiconductor regions in which appropriate dopant profiles are to be established so as to form PN junctions of one or more transistor elements. For example, the active region 102A represents a semiconductor region having an appropriate basic doping so as to correspond to an N-channel transistor 150A, while the semiconductor region 102B may represent a P-channel transistor 150B. The semiconductor regions 102A, 102B are laterally delineated in the semiconductor layer 102 by an isolation structure 102C, for instance a shallow trench isolation.

Moreover, in the manufacturing stage shown, a first gate electrode structure 160A is formed on the active region 102A and comprises a gate insulation layer 161, for instance in the form of a silicon dioxide-based material, possibly in combination with a high-k dielectric material, such as hafnium oxide and the like, while, in other approaches, the high-k dielectric material may be provided in a later manufacturing stage. Moreover, the gate electrode structure 160A comprises a silicon material 162 and a dielectric cap layer 163A, such as a silicon nitride material. Furthermore, a sidewall spacer structure 164 in the form of a silicon nitride material is provided in the gate electrode structure 160A.

Similarly, a gate electrode structure 160B is formed on the active region 102B and comprises the components 161, 162 and 164. Furthermore, a dielectric cap layer 163B in the form of a silicon nitride material is provided, wherein, typically, the dielectric cap layer 163B may have a reduced thickness compared to the dielectric cap layer 163A, which may result in significant yield loss during the further processing of the device 100.

Furthermore, a "gate electrode structure" 160C is provided so as to extend above the active region 102B and the isolation structure 102C and above the active region 102A. The electrode structure 160C may represent any appropriate polysilicon line for connecting the active regions 102A, 102B, or the structure 160C may represent actual gate electrode structures of transistors formed in the active regions 102A, 102B, respectively. The electrode structure 160C also comprises a gate insulation layer 161, at least above the active regions 102A, 102B and the silicon material 162. Moreover, a dielectric cap layer 163C is formed on the silicon material 162 and may have a different thickness caused by the preceding processing of the device 100. In some cases, a substantially non-covered surface area 162C may have been produced during the preceding manufacturing processes, which may also negatively affect the further processing of the device 100.

Moreover, in the manufacturing stage shown, a strain-inducing semiconductor alloy 151, such as a silicon/germanium alloy, is formed in cavities 103, which are provided in the active region 102B laterally adjacent to the gate electrode structure 160B.

The semiconductor device 100 as illustrated in FIG. 1a may be formed on the basis of the following processes. First, the active regions 102A, 102B are geometrically defined in view of their lateral position, size and shape by forming the isolation structure 102C, which is accomplished by forming trenches in the semiconductor layer 102 using appropriate lithography techniques and subsequently refilling the trenches with an appropriate insulating material, such as silicon dioxide, silicon nitride and the like. Next, the basic doping, i.e., the well doping, is established in the active regions 102A, 102B in accordance with the required characteristics of the transistors 150A, 150B, which may be accomplished by using well-established masking regimes in combination with implantation processes. Next, the gate dielectric material 161 is formed, for instance, by oxidation and/or deposition, depending on the process strategy. For instance, if a high-k dielectric material is to be provided in this manufacturing stage, any appropriate deposition techniques are used for forming the high-k dielectric material on a corresponding thin layer of a conventional dielectric material, such as silicon dioxide, silicon oxynitride and the like. If required, an appropriate cap material, such as a conductive cap material (not shown), may be provided so as to confine the high-k dielectric material. Thereafter, the silicon material 162 is deposited, for instance, by well-established low pressure chemical vapor deposition (CVD) techniques, followed by the deposition of the silicon nitride material of the cap layers 163A, 163B and 163C. Furthermore, any further materials, such as hard mask materials, for instance in the form of amorphous carbon and the like, are deposited and are subsequently patterned on the basis of sophisticated lithography and etch techniques, thereby finally forming the gate electrode structures 160A, 160B, 160C, having the required critical dimensions, which may correspond to a gate length, i.e., in FIG. 1a, the horizontal extension of the electrode material 162, of 40 nm and less. After the corresponding gate patterning process, the gate electrode structures 160A, 160B, 160C comprise the dielectric cap materials 163A, 163B, 163C with substantially the same thickness, which may be approximately 40 nm. Thereafter, a spacer layer comprised of silicon nitride material is deposited by any appropriate process technique, such as multilayer deposition, low pressure CVD and the like, in order to obtain the desired material characteristics for the sidewall spacers 164. Subsequently, a resist mask is provided so as to cover the active region 102A and the corresponding part of the isolation structure 102C, while the active region 102B and the adjacent portion of the isolation structure 102C are exposed. On the basis of the corresponding resist mask, an anisotropic etch process is performed to first etch through the silicon nitride material of the spacer layer, thereby forming the sidewall spacers 164 on the gate electrode structure 160B and at the right hand side of the gate electrode structure 160C. Upon further continuing the etch process, based on an appropriate etch chemistry, the cavities 103 may be formed in the active region 102B, wherein a lateral offset from the electrode material 162 of the gate electrode structures 160B, 160C is determined by the width of the previously produced spacer elements 164. When forming the cavities 103, however, the cap layer 163B and the exposed portion of the cap layer 163C are exposed to the reactive etch ambient, thereby increasingly removing material from these layers, which may finally result in the reduced thickness, as is shown in FIG. 1a. After the etch process, the resist mask is removed and any required cleaning processes are performed to prepare the device 100 for a subsequent selective epitaxial growth process for refilling the cavities 103 with the silicon/germanium material 151.

As previously explained, during the selective epitaxial growth process, a significant deposition of material 151 on dielectric surface areas is suppressed so that the spacer layer still formed above the semiconductor region 102A, the gate electrode structure 160A and the electrode structure 160C may suppress, in combination with the spacer structures 164, a material deposition. On the other hand, the material 151 may be efficiently deposited in the cavities 103, while the cap layer 163B in combination with the sidewall spacer structure 164 may confine the electrode material 162. Next, the spacer layer formed above the active region 102A and a portion of the isolation structure 102C is patterned so as to form the sidewall spacer elements 164 of the gate electrode structure 160A and the corresponding portion of the electrode structure 160C, which may be accomplished by forming a resist mask above the active region 102B and the corresponding portion of the electrode structure 160C. It should be appreciated that a certain degree of material erosion may also occur in the cap layer 163A upon patterning the spacer layer, however, at a significantly lesser extent compared to the material loss in the cap layer 163B, which has also experienced the cavity etch process. Furthermore, depending on the alignment accuracy for forming the corresponding resist masks, one of which protects the semiconductor region 102A when etching the cavities 103 and another one of which covers the semiconductor region 102B when patterning the spacer layer so as to form the spacer structure 164 of the gate electrode structure 160A, a significant loss of material may be observed in the spacer layer 163C, when a corresponding portion may be exposed twice to a reactive etch ambient. Consequently, a moderately high probability may exist for producing the substantially exposed surface portion 162C in the transition area of the shared electrode structure 160C. Consequently, the further processing is continued on the basis of a significant difference in layer thickness of the dielectric cap layers 163A, 163B, while also a significant difference in thickness may exist within the cap layer 163C, which may even include the substantially exposed surface portion 162C.

FIG. 1b schematically illustrates the semiconductor device 100 in a further advanced manufacturing stage. As illustrated, the device 100 comprises drain and source regions 152 in the active regions 102A, 102B, in combination with metal silicide regions 154. Furthermore, a spacer structure 155 is formed on the sidewalls of the gate electrode structures 160A, 160B and 160C. Additionally, an interlayer dielectric material 120 or at least a portion thereof is formed so as to enclose the gate electrode structures 160A, 160B, 160C, and comprises, for instance, a silicon nitride layer 121 in combination with a silicon dioxide material 122.

The device 100 as illustrated in FIG. 1b may be formed on the basis of any appropriate process strategy. For example, after patterning the gate electrode structures 160A, 160B, 160C, as shown in FIG. 1a, the drain and source regions 152 in combination with the spacer structure 155 may be formed, for instance, by applying an appropriate masking regime for covering the active region 102B and a corresponding portion of the isolation structure 102C in order to introduce appropriate dopant species into the active region 102A, thereby forming a first portion of the drain and source regions 152. Similarly, upon masking the active region 102A and the associated portion of the isolation structure 102C, appropriate dopant species may be incorporated into the active region 102B. Thereafter, the spacer structure 155 may be formed by using deposition and etch techniques, followed by a further implantation sequence for completing the drain and source regions 152. Thereafter, any required anneal processes are performed, followed by any cleaning processes for preparing the device 100 for the formation of the metal silicide regions 154. Thereafter, any appropriate refractory metal, such as nickel and the like, is deposited and a chemical reaction is initiated upon performing a heat treatment. During the silicidation process, however, metal silicide may also form in any exposed surface portions, such as the portion 162C, thereby generating a metal silicide 154C. Furthermore, a certain probability may also exist at a corner portion 162D that the semiconductor material 162 may be exposed, thereby also creating the metal silicide material. It should be appreciated that the gate electrode structure 160B having the cap layer 163B with the reduced thickness may also suffer from an increased probability of creating metal silicide residues within the semiconductor material 162.

After the silicidation process and the removal of any excess material, the interlayer dielectric material 120 is deposited, for instance, by providing the silicon nitride layer 121 and forming a silicon dioxide material thereon. Next, the surface topography may be planarized on the basis of a polishing process 104, during which the material layer 121 may be exposed and may be subsequently removed, for instance, on the basis of an appropriate polishing recipe. However, due to the significant difference in thickness between the cap materials 163A, 163B, the complex removal process 104 encounters different process conditions, which may affect the degree of exposure of the material 162 in the gate electrode structures 160A and 160B, respectively. Moreover, also within the shared electrode structure 160C, different process conditions may result in a non-complete removal of the cap layer 163C. Consequently, during the further processing, i.e., removal of the materials 162 on the basis of very selective etch recipes, for instance using wet chemical etch chemistries, such as TMAH (tetra methyl ammonium hydroxide) and the like, certain non-uniformities may occur, since typically these etch chemistries are very selective with respect to silicon dioxide, silicon nitride, metal silicide and the like. As a consequence, corresponding material residues may remain in the corresponding openings formed in the gate electrode structures 160A, 160B, 160C, or a corresponding removal of the material 162 may be substantially completely suppressed due to the non-exposure of the material 162 during the removal process 104. Hence, upon refilling the corresponding gate openings with appropriate electrode metals and work function metal species, possibly in combination with a high-k dielectric material, significant variabilities of the electronic characteristics of the resulting gate electrode structures may be observed, or even a total failure of corresponding gate electrode structures may result. Thus, the conventional process flow described above results in a significant yield loss when forming sophisticated high-k metal gate electrode structures on the basis of a replacement gate approach.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which a dielectric cap material of gate electrode structures of different circuit elements may be removed with superior uniformity by significantly reducing any differences in thickness of the dielectric cap materials during the preceding processing. To this end, the process sequence for forming sidewall spacers in the presence of the dielectric cap material may be formed in the same manner for any type of transistors, while an additional hard mask material may then be provided so as to act as a mask for forming cavities and refilling the same with a strain-inducing semiconductor alloy, thereby enabling highly reactive etch recipes to be applied, which may not unduly affect the exposed dielectric cap material. Thereafter, the hard mask material, such as a silicon dioxide material, may be removed without unduly affecting the dielectric cap materials of the gate electrode structures so that the further processing may be continued with very similar device configurations of the gate electrode structures of different transistor types.

One illustrative method disclosed herein comprises forming a first gate electrode structure above a first semiconductor region of a semiconductor device and forming a second gate electrode structure above a second semiconductor region, wherein the first and second gate electrode structures comprise a gate insulation layer, a semiconductor electrode material formed above the gate insulation layer and a dielectric cap layer formed above the semiconductor electrode material. The method further comprises forming a spacer structure on the sidewalls of the first and second gate electrode structures. Moreover, a mask layer is formed above the first semiconductor region and the first gate electrode structure. The method additionally comprises forming cavities in the second semiconductor region while using the dielectric cap layer and the spacer structure of the first gate electrode structure and the mask layer as an etch mask. Additionally, a strain-inducing semiconductor alloy is formed in the cavities by using the dielectric cap layer and the spacer structure of the first gate electrode structure and the mask layer as a growth mask. Moreover, the method comprises removing the mask layer by using the dielectric cap layer and the spacer structure of the first and second gate electrode structure as an etch mask. Additionally, drain and source regions are formed in the first and second semiconductor regions.

A further illustrative method disclosed herein relates to forming a semiconductor device. The method comprises forming a first gate electrode structure above a first semiconductor region and a second gate electrode structure above a second semiconductor region, wherein the first and second gate electrode structures comprise a placeholder electrode material, a dielectric cap layer and a sidewall spacer structure. The method further comprises forming a strain-inducing semiconductor material in the second semiconductor region, while masking the first gate electrode structure and the first semiconductor region with a mask layer. Moreover, the method comprises removing the mask layer by using the dielectric cap layer and the sidewall spacer structure of the first and second gate electrode structures as an etch mask. The method further comprises forming drain and source regions in the first and second semiconductor regions and replacing the placeholder electrode material with a metal-containing electrode material after forming the drain and source regions.

A still further illustrative method disclosed herein relates to forming a semiconductor device. The method comprises forming a sidewall spacer structure on sidewalls of a first gate electrode structure of a first transistor and on sidewalls of a second gate electrode structure of a second transistor, wherein the first and second gate electrode structures comprise a dielectric cap layer formed above a semiconductor electrode material. The method further comprises forming a mask layer above a semiconductor region of the first transistor and above the first gate electrode structure. Additionally, the method comprises forming a strain-inducing semiconductor material in a semiconductor region of the second transistor by using the mask layer, the dielectric cap layer and the sidewall spacer structure as a mask. Furthermore, the mask layer is removed and the dielectric cap layers of the first and second gate electrode structures are removed by performing a common material removal process.

BRIEF DESCRIPTION OF THE DRAWINGS

The disclosure may be understood by reference to the following description taken in conjunction with the accompanying drawings, in which like reference numerals identify like elements, and in which:

FIGS. 1a-1b schematically illustrate cross-sectional views of a semiconductor device during various manufacturing stages in performing a replacement gate approach by removing a dielectric cap layer of gate electrode structures after forming a strain-inducing silicon/germanium alloy in one of the transistors, according to conventional strategies; and FIGS. 2a-2i schematically illustrate cross-sectional views of a semiconductor device during various manufacturing stages in forming a strain-inducing semiconductor alloy in one type of transistor while reducing material erosion of an exposed dielectric cap layer, which may be removed in a later manufacturing stage, for instance upon performing a replacement gate approach, according to illustrative embodiments.

Figure 2C:
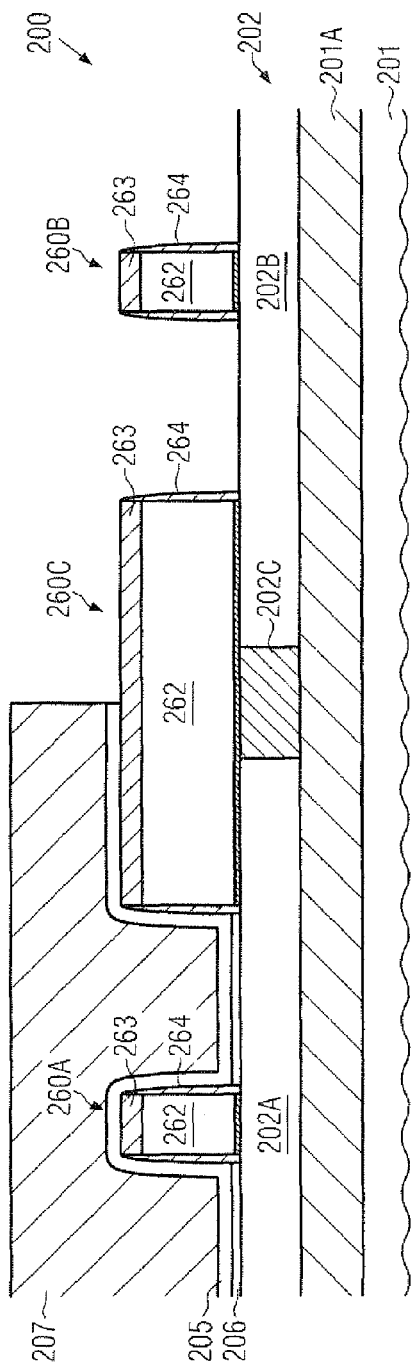

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides manufacturing techniques in which sophisticated high-k metal gate electrode structures may be formed on the basis of dielectric cap layers in the gate stack, wherein the differences in thickness may be significantly less pronounced compared to conventional strategies in that the gate layer stacks of different types of transistors may experience the same process history in view of exposing the dielectric cap layer to a reactive process ambient during the fabrication of a sidewall spacer structure prior to incorporating the strain-inducing semiconductor material in one type of transistor. Thereafter, an appropriate hard mask material, such as silicon dioxide and the like, may be deposited in order to cover one of the transistors and a part of shared gate electrode structures, thereby enabling applying highly selective etch recipes for forming cavities in non-masked active regions of transistors. For example, hydrogen bromide may be used in plasma assisted etch recipes to remove silicon material of exposed active regions, thereby reducing any undue material loss of the dielectric cap material of the non-masked gate electrode structure. Furthermore, after forming the cavities and selectively depositing the strain-inducing semiconductor material in the cavities, the hard mask material may also be removed on the basis of a highly selective etch recipe so that, after the removal of the mask material, the gate electrode structures may have a very similar configuration, in particular with respect to the thickness of the dielectric cap material. As a consequence, the processing of the semiconductor device may be continued on the basis of superior process conditions, i.e., on the basis of very similar gate electrode stacks, which may, thus, result in superior uniformity of the final characteristics of the transistor elements. For example, the dielectric cap material may be removed at any appropriate manufacturing stage, for instance prior to forming a metal silicide in the drain and source regions of the transistors, thereby also enabling the formation of a metal silicide in the semiconductor material of the gate electrode structures. In this case, the high-k dielectric material and the metal-containing electrode material may have been provided in an early manufacturing stage, thereby also adjusting the appropriate work function of the gate electrode structures. Due to the improved uniformity during the removal of the dielectric cap layer, which may be accomplished on the basis of wet chemical etch recipes, such as hot phosphoric acid, or based on reactive ion etching, integrity of the sensitive gate materials, such as the high-k dielectric material, in combination with a metal-containing cap material, may be reliably preserved without requiring undue over-etch times due to the superior uniformity of the dielectric cap material.

In other approaches, the dielectric cap material may be efficiently removed, for instance, on the basis of a polishing process, in a very advanced manufacturing stage, i.e., after completing the basic transistor configuration including metal silicide regions in the drain and source areas, thereby contributing to improved production yield and uniformity of the transistor characteristics compared to conventional approaches, as previously described with reference to FIGS. 1a-1b.

In some illustrative embodiments, the patterning of the hard mask material may be accomplished on the basis of plasma assisted etch techniques in order to reduce any material erosion caused by wet chemical etch recipes so as to not unduly contribute to material erosion in isolation structures and the like.

With reference to FIGS. 2a-2i, further illustrative embodiments will now be described in more detail, wherein reference may also be made to FIGS. 1a-1b, if appropriate.

FIG. 2a schematically illustrates a cross-sectional view of a semiconductor device 200 comprising a substrate 201, above which may be formed a semiconductor layer 202, such as a silicon-based crystalline semiconductor material and the like. It should be appreciated that the semiconductor layer 202 may comprise other components as may be required for forming transistor elements therein and thereon, wherein, however, the electronic characteristics of at least a portion of the semiconductor layer 202 may be improved by providing a strain-inducing semiconductor alloy. Thus, in some illustrative embodiments, the semiconductor layer 202 may comprise a significant fraction of silicon material, in which charge carrier mobility may be increased upon providing a certain type of strain, as previously discussed. Furthermore, in the embodiment shown, the device 200 may represent an SOI configuration, in which a buried insulating layer 201A is positioned between the substrate 201 and the semiconductor layer 202. In other cases, the buried insulating material 201A may not be present, at least in some areas of the device 200, thereby forming at least locally a bulk configuration. Furthermore, the semiconductor layer 202 may comprise a plurality of semiconductor regions or active regions 202A, 202B, which may be laterally delineated by an isolation structure 202C. With respect to the components described so far, the same criteria may apply as previously explained with reference to the semiconductor device 100. For example, the active regions 202A, 202B may represent the active regions of an N-channel transistor and a P-channel transistor, respectively. In the manufacturing stage shown, gate electrode structures 260A, 260B may be formed on the active regions 202A, 202B, respectively. Furthermore, a "shared" electrode structure 260C may be formed on a portion of the active regions 202A, 202B and the isolation structure 202C. The gate electrode structures 260A, 260B, 260C may comprise a gate insulation layer 261, which may represent any conventional dielectric material, such as silicon dioxide, silicon oxynitride and the like, when a corresponding high-k dielectric material is to be provided in a later manufacturing stage. In other cases, the gate insulation layer 261 may comprise a high-k dielectric material, such as hafnium oxide, hafnium silicon oxide and the like, which may be covered by a metal-containing cap material 265, such as a titanium nitride material and the like. In some illustrative embodiments, the gate insulation layer 261 comprising a high-k dielectric material and/or the metal-containing cap material 265 may have incorporated therein an appropriate work function adjusting species, such as lanthanum, aluminum and the like, in order to provide an appropriate work function of the gate electrode structures 260A, 260B, 260C for the corresponding transistors elements still to be completed in and above the active regions 202A, 202B. In other approaches, as will be described later on in more detail, the gate electrode structures 260A, 260B, 260C may represent replacement gate electrode structures, in which the actual adjustment of the work function may be accomplished in a later manufacturing stage, in which a desired metal electrode material may be provided in the gate electrode structures. Furthermore, a semiconductor-based electrode material, 262, such as a silicon material, a silicon/germanium material and the like, may be provided above the gate insulation layer 261 and may be considered as an electrode material or as a placeholder material, when at least the material 262 is to be replaced in a later manufacturing stage. Furthermore, a dielectric cap material 263, which may comprise silicon nitride, may be formed above the semiconductor material 262. It should be appreciated that, with respect to critical dimensions of the gate electrode structures 260A, 260B, 260C, the same criteria may apply as previously discussed with reference to the device 100. Furthermore, in the manufacturing stage shown, a spacer layer 264S comprised of silicon nitride may be formed on the active regions 202A, 202B and on the gate electrode structures 260A, 260B, 260C.

The semiconductor device 200 as illustrated in FIG. 2a may be formed on the basis of any appropriate process strategy, as is, for instance, described with reference to the device 100. That is, the isolation structure 202C and the active regions 202A, 202B may be provided on the basis of process techniques described above and thereafter an appropriate gate layer stack may be formed in accordance with device requirements and the overall process strategy. That is, in a replacement gate approach, the gate insulation layer 261, possibly comprising a high-k dielectric material, and the optional cap material 265, in combination with the semiconductor material 262 and the material of the dielectric cap layer 263 may be deposited, possibly in combination with hard mask materials, and may be subsequently patterned on the basis of sophisticated lithography and etch techniques. In other approaches, in which the semiconductor material 262 may represent an electrode material that is not replaced in a later manufacturing stage, any appropriate process sequence for incorporating work function adjusting species into the material 261 and/or the material 265 may be performed, which may include heat treatments for diffusing a work function adjusting species into at least a portion of the material 261 and the like. Thereafter, the semiconductor material 262 may be deposited, followed by the deposition of the layer 263 and any other materials required for patterning the resulting gate layer stack. Thereafter, the spacer layer 264S may be deposited, for instance, by multilayer deposition techniques, low pressure CVD and the like, wherein a thickness of the layer 264S may be selected so as to obtain spacer elements having a desired width so as to reliably confine the materials 261, the optional material 265 and the material 262 and providing a desired lateral offset for the further processing of the device 200.

FIG. 2b schematically illustrates the semiconductor device 200 in a further advanced manufacturing stage. As illustrated, spacer elements 264 are provided as a part of the gate electrode structures 260A, 260B, 260C, which may be formed from the spacer layer 264S of FIG. 2a in accordance with well-established plasma assisted etch recipes. During the etch process, the etch chemistry for etching silicon nitride material may exhibit a self-limiting behavior with respect to silicon material in that an oxide layer 206 may be formed on the exposed portions of the active regions 202A, 202B, which then may act as an efficient etch stop material. A thickness of the oxide layer 206 may be several nanometers. Furthermore, a hard mask layer 205, in one illustrative embodiment comprised of silicon dioxide, may be formed on the active regions 202A, 202B and the gate electrode structures 260A, 260B, 260C, which now also comprise the spacer elements 264. For example, the hard mask layer 205 may be formed on the basis of any appropriate deposition technique, such as CVD, wherein a thickness may be selected in accordance with requirements for the subsequent processing, i.e., for acting as an etch mask and a growth mask when forming the strain-inducing semiconductor alloy in the active region 202B. For instance, the layer 205 may be provided with a thickness of approximately 10-30 nm. It should be appreciated that the cap layer 263 in each of the gate electrode structures 260A, 260B, 260C may have substantially the same configuration, for instance with respect to layer thickness, since the cap material 263 may have experienced the same process history, since the spacer structure 264 has been formed on each of the gate electrode structures 260A, 260B, 260C.

FIG. 2c schematically illustrates the semiconductor device 200 in a further advanced manufacturing stage. As illustrated, an etch mask 207, such as a resist mask, may be provided so as to cover the active region 202A, the gate electrode structure 260A and a portion of the electrode structure 260C. Moreover, the layer 205 and the material 206 may be removed from exposed portions of the active region 202B. To this end, in some illustrative embodiments, the resist mask 207 may be formed on the basis of well-established lithography techniques followed by a wet chemical etch process, for instance based on hydrofluoric acid (HF) in combination with subsequent cleaning processes, for instance based on sulfuric acid and hydrogen peroxide, thereby also removing the resist mask 207. In other illustrative embodiments, when the application of wet chemical etch recipes, and in particular of any cleaning recipes, may be considered inappropriate, for instance due to any material erosion in device areas that may initially be covered by the resist mask 207 or in any other isolation structures, the non-masked materials 205, 206 may be removed on the basis of a plasma assisted etch process, for which a plurality of established recipes are available for etching silicon dioxide material. Consequently, the etch mask 207 may still reliably cover the gate electrode structure 260A and the active region 202A during the plasma assisted etch process. Thereafter, the resist mask 207 may be removed on the basis of oxygen plasma, thereby avoiding undue material loss in other device areas and also substantially not affecting the mask layer 205 formed above the active region 202A.

Figure 2D:
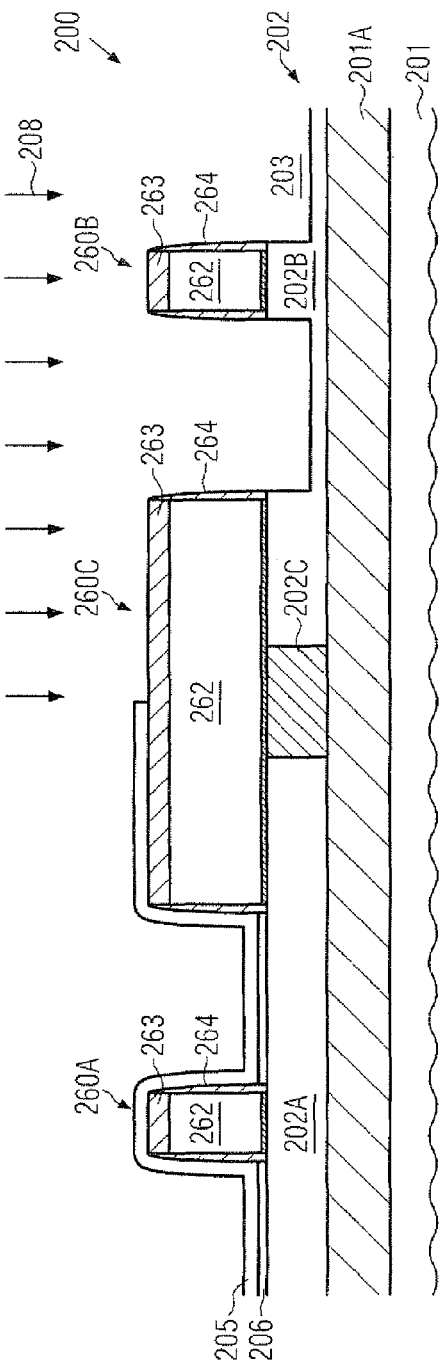

FIG. 2d schematically illustrates the semiconductor device 200 in a further advanced manufacturing stage in which a plasma assisted etch process 208 may be performed to remove material of the active region 202B, while the active region 202A is masked by the mask layer 205. The etch process 208 may be performed on the basis of hydrogen bromide (HBr), which is a well-established etch chemistry for removing silicon material with a high degree of selectivity with respect to silicon nitride and silicon dioxide. Consequently, during the etch process 208, the exposed materials 263 and 264 of the gate electrode structure 260B and a portion of the electrode structure 260C may not suffer from undue material loss, while, on the other hand, the layer 205 may preserve integrity of the gate electrode structure 260A and the other portion of the electrode structure 260C. The cavities 203 may be formed with any desired depth, for instance approximately 50 nm, depending on the overall device requirements. Thereafter, any cleaning processes may be performed, for instance based on HF and the like. It should be appreciated that, in some illustrative embodiments, the chemical resistivity of the mask layer 205 may be enhanced, for instance after depositing the layer 205, after patterning the layer 205 by performing an anneal process, thereby densifying the material of the layer 205. Consequently, a corresponding material loss during any subsequent cleaning processes after forming the cavities 203 may be less pronounced and may be readily taken into consideration when selecting the initial thickness of the layer 205.

FIG. 2e schematically illustrates the device 200 during a selective epitaxial growth process 209 in order to form a strain-inducing semiconductor material 251, such as a silicon/germanium material and the like, in the cavities 203. To this end, any appropriate pretreatments, such as cleaning recipes, heat treatments and the like, may be performed and, thereafter, the actual deposition ambient may be established in accordance with well-established process recipes. During the selective growth process and the preceding processes, the exposed materials 263 and the spacers 264 may act as efficient masks, while the mask layer 205 may efficiently suppress any deposition of the material 251 on the active region 202A.

FIG. 2f schematically illustrates the semiconductor device 200 after the removal of the mask layer 205 and the additional oxide 206 (FIG. 2e). To this end, any appropriate wet chemical etch recipes, for instance based on HF, may be applied. Consequently, due to the high degree of selectivity with respect to silicon nitride material, undue material loss of exposed portions of the cap layers 263 in the gate electrode structure 260B and the corresponding portion of the structure 260C may be avoided. Furthermore, due to the high selectivity, in particular of the etch process for forming the cavities 203, as illustrated in FIG. 2d, the gate electrode structures 260A, 260B, may be very similar in configuration, i.e., a thickness 263A of the cap layer 263 of the gate electrode structure 260A may be similar to a thickness 263B of the gate electrode structure 260B. In this context, the term "similar" may be understood as describing a difference of approximately 6 nm and less, which is significantly less compared to a difference of approximately 20 nm, which may occur in conventional process strategies for a given initial thickness of a dielectric cap material of gate electrode structures, as previously described with reference to the device 100. Moreover, the cap layer 263 may also be continuously formed on the electrode structure 260C, thereby avoiding any exposed areas or any non-sufficiently covered areas in a transition area above the isolation structure 202C.

Consequently, the further processing may be continued on the basis of superior process conditions with respect to the dielectric cap material 263. For example, in some illustrative embodiments (not shown), the further processing may be continued by forming sacrificial spacer elements so as to enable the removal of the dielectric cap layer 263, wherein the superior uniformity may enable reduced etch times, which in turn may allow a reduced thickness of corresponding sacrificial spacer elements. In other cases, the further processing may be continued by forming a first part of drain and source regions in the presence of the cap material 263 and subsequently forming sidewall spacer elements so as to complete the drain and source regions on the basis of the sidewall spacer structure. Thereafter, the dielectric cap material 263 may be removed and the further processing may be continued by forming metal silicide in the drain and source regions and in the semiconductor-based electrode materials 262. It should be appreciated that, in any such process strategy, the threshold voltages and, thus, work functions of the gate electrode structures 260A, 260B, 260C may have been adjusted in an early manufacturing stage, as discussed.

In other process strategies, i.e., in replacement gate approaches, the processing may continue as will be described in more detail with reference to FIGS. 2g-2i.

FIG. 2g schematically illustrates the semiconductor device 200 in an advanced manufacturing stage. As illustrated, a transistor 250A may be formed in and above the active region 202A and may comprise drain and source regions 252 in combination with metal silicide regions 254. Similarly, a transistor 250B may be formed in and above the active region 202B and may comprise the drain and source regions 252 in combination with the metal silicide regions 254. It should be appreciated that the drain and source regions 252 are of inverse conductivity type for the transistors 250A, 250B, when representing complementary transistors. Furthermore, the strain-inducing semiconductor alloy 251 may induce a desired type of strain in a channel region 253 of the transistor 250B, as discussed above. Furthermore, the formation of a metal silicide in the gate electrode structures 260A, 260B, and in particular in the shared electrode structure 260C, may be reliably suppressed due to the dielectric cap layer 263 having the superior uniformity, as discussed above.

Moreover, the device 200 may comprise a portion of an interlayer dielectric material 220, which may comprise a first material layer 221, such as a silicon nitride material, followed by a material layer 222, such as a silicon dioxide layer.

With respect to forming any of the components as shown in FIG. 2g, any appropriate process strategy may be applied, as is also for instance discussed with reference to the device 100.

FIG. 2h schematically illustrates the semiconductor device 200 during a material removal process 204, in which a surface 262S of the semiconductor material 262 in the gate electrode structures 260A, 260B, 260C may be exposed. For example, the process 204 may comprise a polishing process, such as a chemical mechanical polishing process, using well-established process recipes, wherein the superior uniformity of the dielectric cap material 263 (FIG. 2g) may provide superior uniformity during the process 204. Consequently, the surface areas 262S in each of the gate electrode structures 260A, 260B, 260C may be reliably exposed, wherein superior uniformity of the materials 262 may have been achieved by reliably avoiding the formation of any metal silicide, in particular in the gate electrode structure 260C. Consequently, during the further processing, superior process conditions may exist since any undue dielectric material residues and metal silicide areas may be substantially avoided.

Figure 2I:
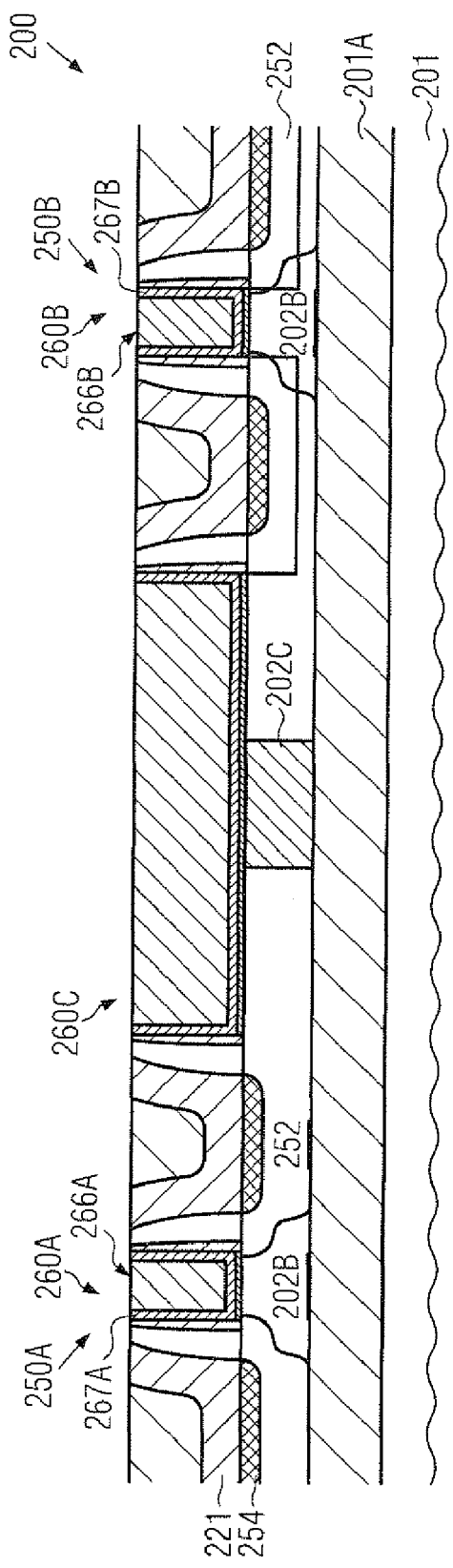

FIG. 2i schematically illustrates the semiconductor device 200 in a further advanced manufacturing stage. As shown, the gate electrode structure 260A may comprise a metal-containing electrode material 266A, which may comprise any appropriate material composition so as to provide a desired work function and conductivity of the gate electrode structure 260A. For example, the electrode material 266A may comprise a material layer 267A, which may include an appropriate work function metal species, such as lanthanum. Similarly, the gate electrode structure 260B may comprise an electrode material 266B resulting in the appropriate work function for the gate electrode structure 260B. For instance, a material layer or layer stack 267B may include an appropriate work function species, such as aluminum and the like. Similarly, the shared electrode structure 260C may comprise the electrode metals 266A, 266B.

The gate electrode structures 260A, 260B may formed on the basis of any appropriate process strategy of well-established replacement gate approaches. That is, starting from the configuration as shown in FIG. 2h, the exposed semiconductor material 262 may be removed, for instance on the basis of any appropriate highly selective etch recipe, and the appropriate materials may be deposited into the resulting gate openings. In other illustrative embodiments, prior to filling in any metal species, a high-k dielectric material may be formed, if this material has not been provided in an early manufacturing stage. For instance, the material 267B may be deposited and may be subsequently removed from the gate electrode structure 260A and the associated portion of the electrode structure 260C. Thereafter, the material 267A may be deposited, followed by the deposition of a further electrode metal, such as aluminum and the like. Thereafter, any excess material may be removed, for instance by CMP and the like.

As a result, the present disclosure provides manufacturing techniques for forming sophisticated high-k metal gate electrode structures in combination with a strain-inducing semiconductor material, wherein superior production yield and device characteristics may be achieved by reducing any differences in thickness of a dielectric cap material upon forming the strain-inducing semiconductor material in one type of transistor. To this end, the sidewall spacer structure may be formed in a common process and subsequently a hard mask material may be applied so as to act as an etch and growth mask upon forming the strain-inducing semiconductor material. In particular, during the etch process for forming cavities in the semiconductor material, highly selective etch recipes may be applied, thereby reducing undue material loss in the exposed dielectric cap material, which may, thus, be removed in a later manufacturing stage on the basis of superior process conditions.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first gate electrode structure above a first semiconductor region of a semiconductor device and a second gate electrode structure above a second semiconductor region, said first and second gate electrode structures comprising a gate insulation layer, a semiconductor electrode material formed above said gate insulation layer and a dielectric cap layer formed above said semiconductor electrode material;
   forming a spacer structure on sidewalls of said first and second gate electrode structures;
   forming a mask layer above said first semiconductor region and said first gate electrode structure;
   performing an annealing process to densify said mask layer;
   forming cavities in said second semiconductor region by using said dielectric cap layer and said spacer structure of said first gate electrode structure and said densified mask layer as an etch mask;
   forming a strain-inducing semiconductor alloy in said cavities by using said dielectric cap layer and said spacer structure of said first gate electrode structure and said densified mask layer as a growth mask;
   removing said densified mask layer by using said dielectric cap layer and said spacer structure of said first and second gate electrode structures as an etch mask; and
   forming drain and source regions in said first and second semiconductor regions.

2. The method of claim 1, wherein forming said mask layer comprises forming said mask layer as a silicon and oxygen containing layer.

3. The method of claim 1, wherein forming said spacer structure comprises forming a silicon nitride spacer element.

4. The method of claim 1, further comprising replacing said semiconductor electrode material with a metal-containing material after forming said drain and source regions.

5. The method of claim 4, wherein replacing said semiconductor electrode material comprises removing said dielectric cap layer in said first and second gate electrode structures so as to expose a surface of said semiconductor electrode material and performing a selective etch process so as to remove said semiconductor electrode material selectively to said spacer structure.

6. The method of claim 5, wherein removing said dielectric cap layer of said first and second gate electrode structures comprises performing a polishing process.

7. The method of claim 1, wherein forming said first and second gate electrode structures comprises incorporating a high-k dielectric material in said gate insulation layer.

8. The method of claim 1, wherein forming said first and second gate electrode structures comprises forming a first work function adjusting species in said first gate electrode structure and forming a second work function adjusting species in said second gate electrode structure prior to forming said spacer structure.

9. The method of claim 1, wherein forming said mask layer comprises forming a mask material above said first and second semiconductor region, forming a resist mask so as to cover said mask material above said first semiconductor region and expose said mask material above said second semiconductor region and performing a plasma assisted etch process so as to remove said exposed mask material from above said second semiconductor region.

10. A method of forming a semiconductor device, the method comprising:
forming a first gate electrode structure above a first semiconductor region and a second gate electrode structure above a second semiconductor region, said first and second gate electrode structures comprising a placeholder electrode material, a dielectric cap layer and a sidewall spacer structure;
forming a densified mask layer above said first gate electrode structure and said first semiconductor region, wherein forming said densified mask layer comprises:
forming a mask material above said first and second semiconductor regions;
removing said mask material selectively from above said second semiconductor region by performing a plasma assisted etch process; and
performing an annealing process on said mask material;
forming a strain-inducing semiconductor material in said second semiconductor region, while masking said first gate electrode structure and said first semiconductor region with said densified mask layer;
removing said densified mask layer by using said dielectric cap layer and said sidewall spacer structure of said first and second gate electrode structures as an etch mask;
forming drain and source regions in said first and second semiconductor regions; and
replacing said placeholder electrode material with a metal-containing electrode material after forming said drain and source regions.

11. The method of claim 10, wherein forming said mask material comprises forming a silicon dioxide material.

12. The method of claim 10, wherein said dielectric cap layer and said sidewall spacer structure are comprised of silicon nitride.

13. The method of claim 10, wherein forming said first and second gate electrode structures comprises forming a gate insulation layer comprising a high-k dielectric material.

14. The method of claim 13, wherein said high-k dielectric material is provided prior to forming said strain-inducing semiconductor material.

15. A method of forming a semiconductor device, the method comprising:
forming a sidewall spacer structure on sidewalls of a first gate electrode structure of a first transistor and on sidewalls of a second gate electrode structure of a second transistor, said first and second gate electrode structures comprising a dielectric cap layer formed above a semiconductor electrode material;
forming a mask layer above a semiconductor region of said first transistor and above said first gate electrode structure;
performing an annealing process to densify said mask layer;
forming a strain-inducing semiconductor material in a semiconductor region of said second transistor by using said densified mask layer, said dielectric cap layer and said sidewall spacer structure as a mask;
removing said densified mask layer by using said dielectric cap layer and said sidewall spacer structure of said first and second gate electrode structures as an etch mask; and
removing said dielectric cap layers of said first and second gate electrode structures by performing a common material removal process.

16. The method of claim 15, wherein performing said common material removal process comprises performing a polishing process.

17. The method of claim 15, wherein removing said densified mask layer comprises performing a plasma assisted etch process.

18. The method of claim 15, wherein said dielectric cap layers of said first and second gate electrode structures are removed after forming drain and source regions of said first and second transistors.

* * * * *